US010698012B2

(12) United States Patent
Tseng et al.

(10) Patent No.: US 10,698,012 B2
(45) Date of Patent: Jun. 30, 2020

(54) POWER MEASURING SYSTEM AND POWER MEASURING METHOD

(71) Applicant: INDUSTRIAL TECHNOLOGY RESEARCH INSTITUTE, Hsinchu (TW)

(72) Inventors: Ko-Ying Tseng, Hsinchu (TW); Bo-Yin Chu, Hsinchu (TW); Hsin-Yi Chung, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 335 days.

(21) Appl. No.: 15/854,938

(22) Filed: Dec. 27, 2017

(65) Prior Publication Data

US 2019/0137551 A1    May 9, 2019

(30) Foreign Application Priority Data

Nov. 9, 2017    (TW) .............................. 106138771 A

(51) Int. Cl.
*G01R 21/133*    (2006.01)
(52) U.S. Cl.
CPC .................................. *G01R 21/133* (2013.01)
(58) Field of Classification Search
CPC ...... G01R 21/133; G01R 21/1333; H02J 3/14
See application file for complete search history.

(56) References Cited

U.S. PATENT DOCUMENTS

| 5,049,809 | A | 9/1991 | Wakatsuki et al. |
| 8,209,062 | B2 | 6/2012 | Andrews et al. |
| 8,694,291 | B2 | 4/2014 | Chu et al. |
| 8,738,195 | B2 | 5/2014 | Aldridge et al. |

(Continued)

FOREIGN PATENT DOCUMENTS

| CN | 104136929 | 11/2014 |
| TW | I391675 | 4/2013 |

(Continued)

OTHER PUBLICATIONS

Ruzzelli, et al. "Real-Time Recognition and Profiling of Appliances through a Single Electricity Sensor", Sensor Mesh and Ad Hoc Communications and Networks (SECON), 2010 7th Annual IEEE Communications Society Conference, Jun. 2010.

(Continued)

*Primary Examiner* — Bryan Bui
(74) *Attorney, Agent, or Firm* — Amin, Turocy & Watson, LLP

(57) ABSTRACT

A method for measuring electric power includes: mounting a sensing device on a wire between a capturing device and an electronic goods, wherein the capturing device is used for capturing a total power consumption value of the wire; measuring a relative electricity value of the wire using the sensing device; establishing a solution model based on the relative electricity value to output a loop power consumption result of the wire; determining whether the solution model satisfies a predefined condition, wherein the predefined condition includes the loop power consumption result of the wire being close to the power consumption value captured by the capturing device; and when the solution model satisfies the condition, outputting an absolute electricity value of the wire.

15 Claims, 4 Drawing Sheets

(56) References Cited

U.S. PATENT DOCUMENTS

| | | | |
|---|---|---|---|
| 9,104,189 B2* | 8/2015 | Berges Gonzalez | ........................ G05B 19/0428 |
| 9,506,963 B2* | 11/2016 | Savvides | ................ G06Q 50/06 |
| 9,625,504 B2 | 4/2017 | Bruel | |
| 2011/0213739 A1 | 9/2011 | Benitez et al. | |
| 2012/0290230 A1* | 11/2012 | Berges Gonzalez | ........................ G05B 19/0428 702/61 |

FOREIGN PATENT DOCUMENTS

| | | |
|---|---|---|
| TW | I423549 | 1/2014 |
| TW | I439700 | 6/2014 |
| TW | I444627 | 7/2014 |
| TW | I446675 | 7/2014 |
| TW | I517079 | 1/2016 |
| TW | I522627 | 2/2016 |

OTHER PUBLICATIONS

Trung, et al. "An Innovative Non-Intrusive Load Monitoring System for Commercial and Industrial Application", The 2012 International Conference on Advanced Technologies for Communications, Oct. 2012 p. 23-p. 27.

Shao, et al. "A Temporal Motif Mining Approach to Unsupervised Energy Disaggregation: Applications to Residential and Commercial Buildings", AAAI'13 Proceedings of the Twenty-Seventh AAAI Conference on Artificial Intelligence, Jul. 2013 p. 1327-p. 1333.

Aladesanmi, et al. "Overview of non-intrusive load monitoring and identification techniques", International Federation of Automatic Control 2015 p. 415-p. 420.

Chen, et al. "Analysis of Appliance Load Intelligent Monitoring for Principle and Architecture", Feb. 2013 p. 38-p. 46.

Taiwanese Office Action for Taiwanese Patent Application No. 106138771 dated May 9, 2018.

* cited by examiner

POWER MEASURING SYSTEM AND POWER MEASURING METHOD

CROSS-REFERENCE TO RELATED APPLICATION

The present disclosure is based on, and claims priority from, Taiwan Application Number 106138771, filed Nov. 9, 2017, the disclosure of which is hereby incorporated by reference herein in its entirety.

BACKGROUND

1. Technical Field

The present disclosure relates to systems and methods for measuring electric power, and, more particularly, to a power measuring method and a power measuring system that apply non-intrusive load monitoring in conjunction with a self-learning algorithm.

2. Description of Related Art

Global climate change has led to increasing demands for energy-saving improvement services and behavior management, and energy efficiency of systems has become more and more important. In order to address these demands, a large number of smart electricity meters are relied upon to determine the operating statuses and distribution of power consumptions of equipment.

The so-called electricity meter is used to measure the amount of power consumption of a single site, such as the electricity consumption of a residential site, a factory, a commercial building and the like. It is installed at the site of the main power supply, so that users can find out the power consumption in order to carry out power management for the purpose of energy saving.

However, in a single site, a plurality of wires are often laid out to provide different usage requirements (such as for different floors or different interior spaces). For example, commercial and industrial departments often have more complicated loads and larger number of devices, so each wire needs to be equipped with an electricity meter. As a result, the electricity management office of that site will have to accommodate a plurality of electricity meters. Furthermore, due to the large number of installations, the costs of electricity meter equipment and the cost of construction and installation are high, and the installation is complicated.

Therefore, a Current Transformer (CT) technique has been developed, in which various wires are collected on a distribution panel, and then a current transformer is installed at the junction of each electric wire of the distribution board, so that one electric wire corresponds to a single current transformer. The current transformers are then pooled together in an electricity meter mainframe via extension cords. Therefore, through the use of multiple sets of current transformers and a single electricity meter mainframe, the electricity information for each circuit can be obtained. Thus, only one electricity meter mainframe needs to be installed to obtain information on power consumption.

However, an extension cord needs to be pulled from each of the current transformers. As such, a large amount of extension cords sprawl from the distribution panel, making installation or maintenance cumbersome.

In addition, the current transformer usually requires high accuracy. Higher accuracy usually comes with a higher price. Double the accuracy, when translated into a price, often means several times more than the original price. In other words, it is very costly in terms of design complexity, material cost, calibration and etc. to achieve absolute accuracy. Due to their high cost, the total cost for installing the current transformers sometimes exceeds the total cost for installing the electricity meter mainframe, resulting in them not being widely accepted in the energy-saving field.

Therefore, a Non-intrusive Load Monitoring (NILM) technique has been developed. Wires are collected on a distribution panel, and the electricity and operating status of each individual electrical equipment (such as equipment switch) is directly monitored and identified by a smart electricity meter of high precision, eliminating the need to pull extension cords from the distribution panel.

However, the conventional smart electricity meters using a non-intrusive load monitoring method are mostly used in residential home, only the electricity status of the same appliance of each wire can be analyzed. When the wire is used for a different appliance, the electrical characteristics of the wire cannot be effectively analyzed, and thus power management cannot be realized.

Moreover, due to the variety of types and models of electrical equipment, if the electricity characteristics of a single wire supplying power to different electrical appliances are to be determined, artificial intelligence is often required to teach a computer to compute and store the electricity characteristics of various electrical appliances on the single wire, otherwise manual information feedback is required in order to establish a database of the load characteristics of a user's appliances. As a result, the prediction accuracy of this method is susceptible to the integrity of the establishment of the database. Furthermore, when the equipment is changed, the computer needs to re-learn all the electrical characteristics in order to update the database. This is why it has poor use in complex environment and in frequency conversion equipment, making it extremely inconvenient to use, and thus difficult to be widely used.

Moreover, the conventional smart electricity meters are extremely expensive to install and therefore difficult to be applied in fields where there are a large number of wires.

Therefore, there is a need for a solution that addresses the aforementioned issues in the prior art.

SUMMARY

The present disclosure provides a method for measuring electric power, which may include: mounting at least one sensing device on at least one wire between a capturing device and an electronic goods, wherein the capturing device is used for capturing a power consumption value of the at least one wire; measuring a relative electricity value of the at least one wire using the sensing device; establishing a solution model based on the relative electricity value to obtain and output a loop power consumption result of the at least one wire; determining whether the solution model satisfies a predefined condition, wherein the predefined condition includes the loop power consumption result of the at least one wire being close to the power consumption value captured by the capturing device; and when the solution model satisfies the predefined condition, outputting an absolute electricity value of the at least one wire.

In an embodiment, the sensing device is a contactless electricity sensing device, such as a current transformer, a Rogowski coil and a Hall sensor.

In an embodiment, the solution model is established based on an artificial intelligent optimization process, such as a Particle Swarm Optimization, a Genetic Algorithm and a Differential Evolution process.

The present disclosure further provides a system for measuring electric power, which may include: a wire with two opposite ports; a capturing device connected to one of the two ports of the wire for capturing a power consumption value of the wire; a sensing device provided between the two ports for measuring a relative electricity value of the wire; and a data processing device for receiving signal data transmitted from the sensing device and electricity data of the capturing device to perform calculations on the signal data and the electricity data to perform power consumption analysis on the wire, wherein the power consumption analysis includes: reading the relative electricity value from the sensing device; establishing a solution model based on the relative electricity value to output a loop power consumption result of the wire; determining whether the solution model satisfies a predefined condition, wherein the predefined condition includes the loop power consumption result of the at least one wire being close to the power consumption value captured by the capturing device; and when the solution model satisfies the predefined condition, outputting an absolute electricity value of the wire.

In an embodiment, the sensing device measures an electricity usage value including a voltage, a current, a power factor, or a power.

In an embodiment, the data processing device uses a precision compensation method that performs calculations on the electricity data obtained by the capturing device and the relative electricity value obtained by the sensing device to obtain the absolute electricity value of the wire to be measured.

In an embodiment, the relative electricity value is a relative current value.

In an embodiment, the absolute electricity value is an absolute power consumption value.

In an embodiment, when the solution model fails to satisfy the predefined condition, error correction is performed by the capturing device based on the solution model in conjunction with the power consumption value to obtain an error correction coefficient for the relative electricity value, and the absolute electricity value is calculated from the solution model based on the relative electricity value and the error correction coefficient.

As can be understood from the above, in the power measuring method and power measuring system according to the present disclosure, low cost, easy assembly and usage are achieved primarily through the contactless electricity sensing device and the self-learning algorithm of the solution model.

DETAILED DESCRIPTION

Figure 1A:
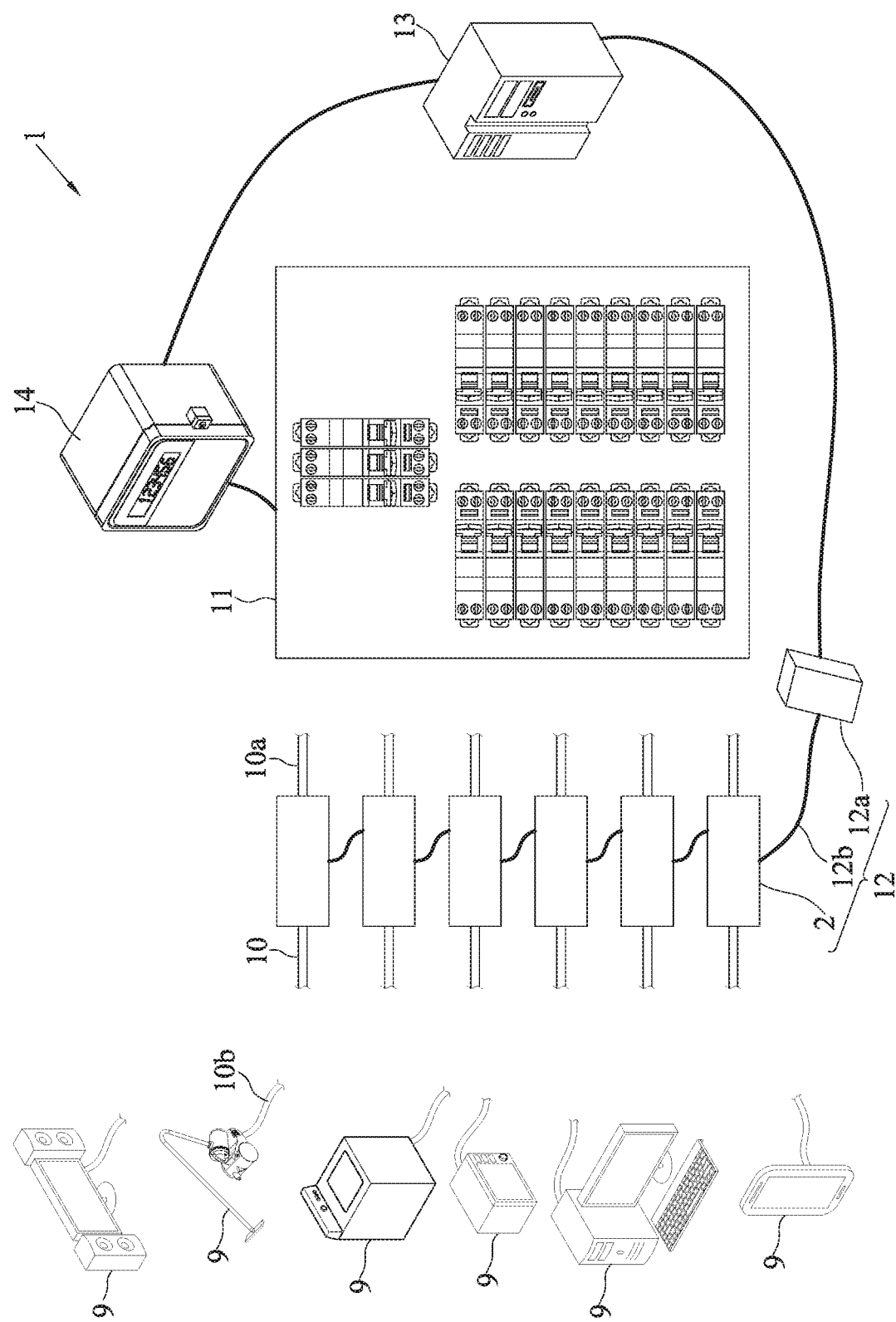
FIG. 1A is a schematic diagram depicting the arrangement of a power measuring system in accordance with the present disclosure.

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "first" and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 1B:
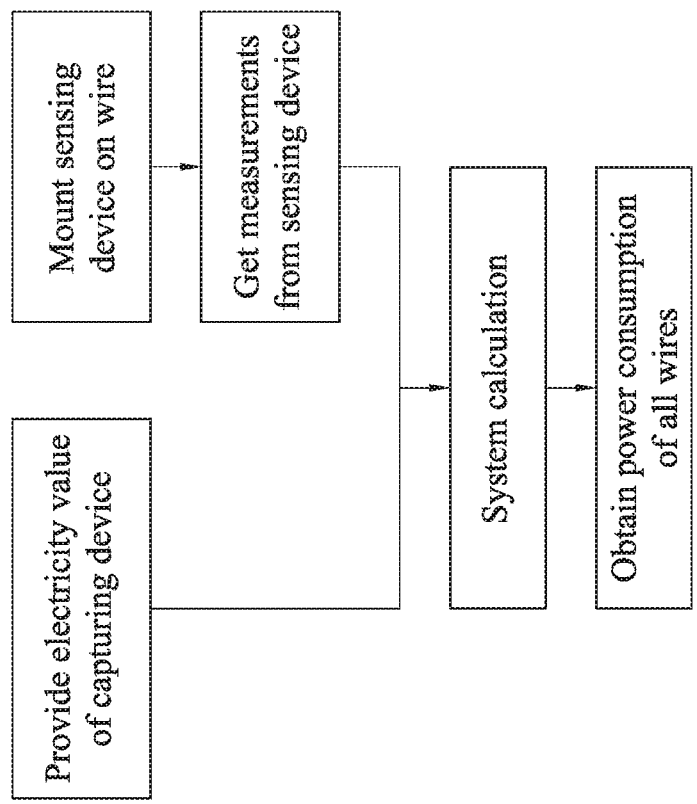
FIG. 1B is a schematic diagram depicting the operation of a power measuring system in accordance with the present disclosure.

FIGS. 1A and 1B are schematic diagrams illustrating the arrangement and operation of a power measuring system 1 in accordance with the present disclosure, respectively. As shown in FIG. 1A, the power measuring system 1 includes a wire assembly device 11, a capturing device 14, a sensing set 12, and a data processing device 13 for system computation.

The wire assembly device 11 is a distribution panel electrically connected with a plurality of wires 10, such that one port 10a of each of the wires 10 is connected to the wire assembly device 11, while the other end 10b thereof is used for supplying power to an electronic goods 9. The capturing device 14 is used to detect the electricity information on the wire assembly device 11. The electronic goods 9 is, for example, a home appliance, a 3C product, an industrial machinery or other electrical product.

In an embodiment, the capturing device 14 is a summation electricity meter for obtaining the electrical energy usage of the wire assembly device 11, such as watt hour (unit: kWh), total power (unit: kW), current (unit: A), voltage value (unit: V), instantaneous power factor (PF), total watt hour of individual phase, power of individual phase (unit: kW), current of individual phase (unit: A), the voltage value of individual phase (unit: V), instantaneous PF of individual phase.

The sensing set 12 includes at least one contactless sensing device 2 and a data storage device 12a for receiving signals from the sensing device 2. When a plurality of sensing devices 2 are used, the sensing devices 2 are connected to the data storage device 12a via transmission lines (or cords) 12b connected in parallel. The sensing device 2 performs non-intrusive sensing on the wires 10. The data storage device 12a is, for example, a personal computer, an industrial computer, a server, a programmable logic controller (PLC), a network interface converter, or various devices that support a common protocol.

In an embodiment, the sensing device 2 is a contactless electricity sensing device, such as a current transformer, a Rogowski coil or a Hall sensor, and obtains the relative electricity values (such as voltage, current, power factor, power and other electricity usage values) of a single wire 10.

The data processing device 13 is used for receiving signal data (measurements) transmitted from the data storage device 12a (or the sensing devices 2) and the electricity data (actual values) from the capturing device 14 (or summation electricity meter), and performing synchronous computing analysis on these two sets of data to carry out data storage and correction calculation of the electricity usage values, thereby converting the measurements obtained by the sensing devices 2 into absolute power consumption value.

In an embodiment, the data processing device 13 includes a data collecting unit, a data storage unit and a data computing unit. The data collecting unit collects information from the summation electricity meter and the sensing devices 2 via a RS485 communication protocol. The data storage unit captures the power consumption value of the summation electricity meter and the current value of the sensing device 2 on each of the wires 10 at the same time instance. The data computing unit performs power consumption analysis of each of the wires 10 through an adaptive error correction modeling technology using the power consumption value of the summation electricity meter as the target value.

Figure 2:
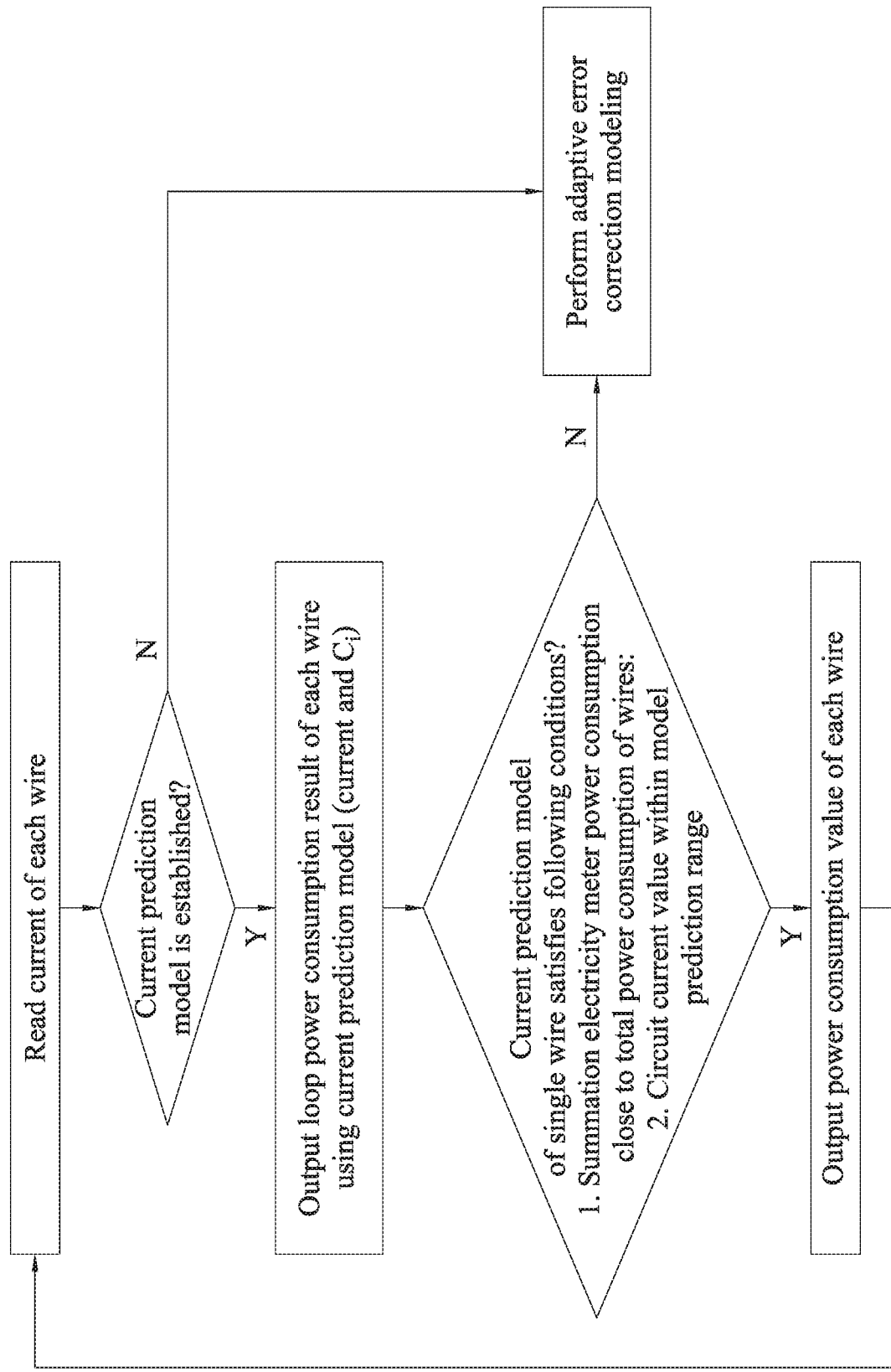
FIG. 2 is a flowchart illustrating a power measuring method in accordance with the present disclosure.

Furthermore, as shown in FIG. 2, the power consumption analysis (or power consumption measurement) of a wire 10 performed by the data computing unit of the data processing device 13 includes the following steps of: reading a current of the wire 10; determining if a current prediction module is established; outputting a loop power consumption result of the wire using the current prediction model; determining whether the current prediction model satisfies two conditions, one being that the power consumption of the summation electricity meter is close to the total calculated power consumption of the wires 10, the other being that the value of the circuit current is in within the model prediction range; and outputting the power consumption value of each wire 10.

Figure 3:
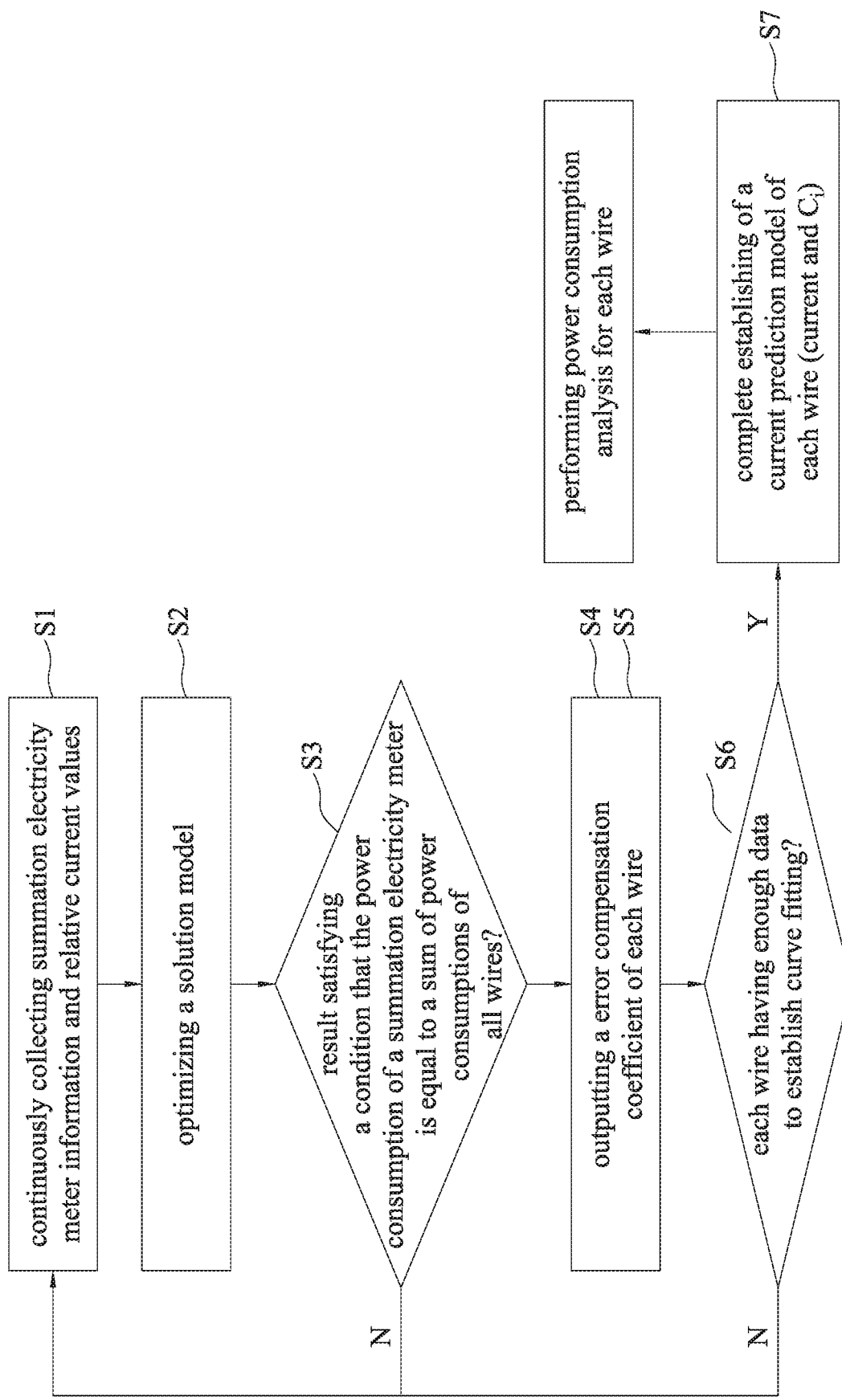
FIG. 3 is a flowchart illustrating an adaptive error correction modeling operation of FIG. 2.

More specifically, if a current prediction module is not established or the current prediction module fails to satisfy both of the conditions, an adaptive error correction modeling operation is performed. As shown in FIG. 3, the operation includes the following steps.

Step S1: The measurements from the summation electricity meter and the sensing devices 2, e.g., current $I_i$ of all the wires 10 are simultaneously collected.

Step S2: A solution model of the total power consumption of the summation electricity meter and the data from each of the wires 10 is established according to the equation below:

$$kW_{sum} = \sum_{i=1}^{N} (I_i \times V_i \times C_i), \text{ wherein } C_i = Err_{Fi} \times pf_i.$$

$kW_{sum}$ in the above equation is the summation electricity meter kW value of the wire assembly device 11 (distribution panel).

N in the above equation is the number of wires 10 being measured.

$I_i$ in the above equation is the current measurement (relative current value) of the sensing device 2 on an $i^{th}$ wire 10.

$V_i$ in the above equation is the voltage value of the $i^{th}$ wire 10.

$C_i$ in the above equation is the error compensation coefficient of the wire 10.

$Err_{Fi}$ the above equation is the current error correction coefficient of the sensing device 2 on the $i^{th}$ wire 10.

$pf_i$ in the above equation is the power factor of the $i^{th}$ wire 10, wherein $pf_i$ is derived only after the voltage and the current of the measured wire 10 are captured by the capturing device 14 (summation electricity meter).

The above equation is able to directly work out the multiplication of $pf_i$ and $Err_{Fi}$. Only the relative current value of a wire 10 is needed to estimate the power consumption of that wire 10. This achieves the equivalent effect of measuring the power consumption of the wires by mounting an electricity meter on each of the wires in the prior art.

Step S3: The above equation as the target equation is defined and a numerical model solution is found through an artificial intelligent optimization process (e.g., a Particle Swarm Optimization, a Genetic Algorithm or a Differential Evolution process etc.) to obtain the error compensation coefficient of each of the wires 10, and the instantaneous power consumption of each wire 10 is simultaneously calculated, such that the result satisfies the condition that "the power consumption of the summation electricity meter is close or equal to (regarded as equal when within an error range) the sum of the calculated power consumption of each wire 10."

Step S4: Each of the analysis results from step S3 is stored in the data storage unit, that is, error compensation coefficients corresponding to a single wire 10 (or each of the wires 10) under different measurements of the sensing device 2 are stored, such that when the same wire 10 is used for a different electrical equipment, users do not need to re-calibrate. In other words, error compensation can be performed for various relative values.

Step S5: Records of the error compensation coefficients of each of the wires 10 under different relative current values are continuously established through steps S1-S4. Thereafter, the relative current value measured by the sensing device 2 is directly converted into a current.

Step S6: It is determined whether the data storage unit has established error compensation coefficients corresponding to all the relative current values for each of the wires 10, for example, has established a curve fitting.

Step S7: If step S6 is satisfied, then the modeling is completed and ready for the power consumption analysis of FIG. 2; else, the steps S1-S6 for the adaptive error correction modeling operation are repeated.

Simply put, the above adaptive error correction modeling operation calculates a supposed power consumption value of a wire 10 based on the total power (or individual power), then performs error compensation on the power consumption value of the wire 10 measured by the sensing device 2 (i.e., inserts an error compensation coefficient $C_i$), and iterative operations are performed as needed such that the measurement of the sensing device 2 after compensation approaches the supposed power consumption value. Therefore, using the power consumption analysis adopting the adaptive error correction modeling, the power analysis (the predicted power consumption) for a wire 10 performed by the data processing device 13 is similar to the power consumption value (the actual power consumption) measured by a prior-art electricity meter if it were to be mounted on the wire 10.

In addition, the present disclosure provides a power measuring method applicable to the power measuring system 1, which includes mounting at least one sensing device 2 on at least one wire 10 between a capturing device 14 and an electronic goods 9, wherein the capturing device 14 is used for capturing a power consumption value of the wire 10, the sensing device 2 is used for measuring a relative power value of the wire 10, and a solution model is established based on the relative power value to output a loop power consumption result of the wire 10. Then, it is determined whether the solution model satisfies at least one condition. The condition includes the loop power consumption result of each of the wires 10 being close to the sum of the power consumption values of the capturing device 14. When the solution model satisfies the condition, the absolution power value of each of the wires 10 is outputted.

In the power measuring system 1 and the power measuring method according to the present disclosure, the capturing device 14 (or the summation electricity meter or digital electricity meter) of a building or a site is used in cooperation with at least the sensing device 2 and the data processing device 13 to estimate an individual power consumption actual value of each wire 10 (or a single wire) through a precision compensation method (i.e., the adaptive error correction modeling operation). More particularly, through the precision compensation method, the data processing device 13 performs operations on the electricity information (e.g., current, power factor, power etc.) in absolute values obtained by the capturing device 14 and the relative electricity values (e.g., voltage, current, power, power factor etc.) measured by the sensing device 2 to obtain the absolute power values of all wires to be measured. Moreover, in terms of hardware design, the configuration of the power measuring system 1 is designed with relative precision in mind, configurations with absolute measurement precision and high cost are not necessary. For example, the sensing device 2 can have the form factor of a mini auxiliary sensor instead of that of a meter. Therefore, effective measurements can be achieved with low-cost component and low-cost circuit design. Compared to the prior art, the power measuring system 1 has a cost that is greatly reduced.

Furthermore, the measuring hardware of the power measuring system 1 adopts a contactless measuring concept. For example, the sensing device 2 can be directly adhered onto the outer surface of the floating platform 10 to obtain the required measurements. Therefore, when the power measuring system 1 is taking measurements, no cumbersome and dangerous wiring engineering work is necessary, and no time is wasted on load labeling operation for the electrical equipment.

In addition, in order for the values measured to be represented in absolute unit, an adaptive measurement error correction technique (e.g., the adaptive error correction modeling operation) is provided, such that during calculation of the power consumption of each wire 10, the absolute power of the wire 10 mounted with a sensing device 2 can be obtained using the instantaneous calculations of the adaptive measurement error correction technique, so that the power consumption calculated is substantially equivalent to the result measured if a prior-art electricity meter were to be mounted on the wire as described in the prior art. As a result, when the same wire 10 is used for a different electronic goods 9, users do not need to re-calibrate. It is not only easy to use, but can be applied to frequency-conversion equipment and complex environment.

In conclusion, the power measuring system and the power measuring method according to the present disclosure use the capturing device 14 to capture the circuit total power consumption value, and incorporate the sensing set 12 including at least the contactless electricity sensing device 2 and a self-learning algorithm (e.g., the adaptive error correction modeling operation) to measure the electricity information of at least one wire 10 and derive a power consumption value of the wire 10 based on the electricity information using the self-learning algorithm, such that the loop total power consumption value captured by the capturing device 14 is equal to the sum of the loop power consumptions of all the wires 10, thereby achieving low-cost measurement, easy assembly and use, energy saving, and equipment diagnosis.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A method for measuring electric power, comprising:
   mounting at least one sensing device on at least one wire between a capturing device and an electronic goods, wherein the capturing device captures a power consumption value of the at least one wire;
   measuring, by the sensing device, a relative electricity value of the at least one wire;
   establishing a solution model based on the relative electricity value to obtain and output a loop power consumption result of the at least one wire;
   determining whether the solution model satisfies a predefined condition, wherein the predefined condition includes the loop power consumption result of the at least one wire being close to the power consumption value captured by the capturing device; and
   when the solution model satisfies the predefined condition, outputting an absolute electricity value of the at least one wire.

2. The method of claim 1, wherein the absolute electricity value is an absolute power consumption value.

3. The method of claim 2, further comprising, before the solution model reaches to satisfaction of the predefined condition in determining whether the solution model satisfies the predefined condition, performing error correction by the capturing device based on the solution model in conjunction with the power consumption value to obtain an error correction coefficient for the relative electricity value.

4. The method of claim 3, wherein the absolute electricity value is calculated from the solution model based on the relative electricity value and the error correction coefficient.

5. The method of claim 1, wherein the sensing device is a contactless electricity sensing device.

6. The method of claim 5, wherein the contactless electricity sensing device is a current transformer, a Rogowski coil or a Hall sensor.

7. The method of claim 1, wherein the solution model is established based on an artificial intelligent optimization process.

8. The method of claim 7, wherein the artificial intelligent optimization process is a Particle Swarm Optimization, a Genetic Algorithm or a Differential Evolution process.

9. A system for measuring electric power, comprising:
   a wire having two opposite ports;
   a capturing device connected to one of the two ports of the wire and configured to capture a power consumption value of the wire;
   a sensing device provided between the two ports and configured to measure a relative electricity value of the wire; and
   a data processing device configured to receive signal data transmitted from the sensing device and electricity data of the capturing device for performing calculations on the signal data and the electricity data and performing power consumption analysis on the wire, wherein the power consumption analysis includes:

reading the relative electricity value from the sensing device;

establishing a solution model based on the relative electricity value to output a loop power consumption result of the wire;

determining whether the solution model satisfies a predefined condition, wherein the predefined condition includes the loop power consumption result of the wire being close to the power consumption value captured by the capturing device; and when the solution model satisfies the predefined condition, outputting an absolute electricity value of the wire.

10. The system of claim 9, wherein the absolute electricity value is an absolute power consumption value.

11. The system of claim 9, wherein before the solution model reaches to satisfaction of the predefined condition in determining whether the solution model satisfies the predefined condition, the capturing device is configured to perform error correction based on the solution model in conjunction with the power consumption value to obtain an error correction coefficient for the relative electricity value.

12. The system of claim 11, wherein the absolute electricity value is calculated from the solution model based on the relative electricity value and the error correction coefficient.

13. The system of claim 9, wherein the sensing device is configured to measure an electricity usage value.

14. The system of claim 13, wherein the electricity usage value is a voltage, a current, a power factor, or a power.

15. The system of claim 9, wherein the data processing device is configured to perform, by a precision compensation method, calculations on the electricity data obtained by the capturing device and the relative electricity value obtained by the sensing device to obtain the absolute electricity value of the wire to be measure.

* * * * *